(12) United States Patent
Hudson et al.

(10) Patent No.: US 6,765,804 B2
(45) Date of Patent: Jul. 20, 2004

(54) PRINTED CIRCUIT INTERFACE TO AN I/O CONNECTOR

(75) Inventors: Don Richard Hudson, Salt Lake City, UT (US); Barry Wynn Albright, Salt Lake City, UT (US)

(73) Assignee: Thomson Licensing S. A., Boulogne (FR)

( * ) Notice: Subject to any disclaimer, the term of this patent is extended or adjusted under 35 U.S.C. 154(b) by 0 days.

(21) Appl. No.: 10/136,568

(22) Filed: Apr. 30, 2002

(65) Prior Publication Data

US 2002/0176240 A1 Nov. 28, 2002

Related U.S. Application Data

(60) Provisional application No. 60/290,575, filed on May 11, 2001.

(51) Int. Cl.[7] .................................................. H05K 7/14
(52) U.S. Cl. ...................... 361/799; 439/951; 439/507
(58) Field of Search .............................. 439/63, 65, 78, 439/82, 74, 92, 95, 108, 857, 951, 507, 513; 361/736, 739, 801

(56) References Cited

U.S. PATENT DOCUMENTS

| | | | |
|---|---|---|---|
| 5,250,751 A | * | 10/1993 | Yamaguchi ............ 174/35 GC |
| 5,282,113 A | * | 1/1994 | Kohama et al. ............ 361/737 |
| 5,827,094 A | * | 10/1998 | Aizawa et al. ............ 439/857 |
| 6,065,976 A | | 5/2000 | Wang ............ 439/63 |
| 6,123,550 A | | 9/2000 | Burkert et al. ............ 439/63 |
| 6,238,218 B1 | * | 5/2001 | Baffert ............ 439/63 |
| 6,468,089 B1 | * | 10/2002 | Hubbard et al. ............ 439/63 |

FOREIGN PATENT DOCUMENTS

| | | | |
|---|---|---|---|
| DE | 296 21 580 U | 8/1997 | ............ H01R/23/68 |
| DE | 197 01 034 A | 8/1998 | ............ H01R/23/68 |
| FR | 2 793 955 | 5/1999 | ............ H01R/12/18 |

* cited by examiner

Primary Examiner—Thanh S. Phan
(74) Attorney, Agent, or Firm—Joseph S. Tripoli; Harvey D. Fried; Francis A. Davenport

(57) ABSTRACT

A circuit board arrangement facilitates a direct connection to a chassis mounted connector. The arrangement comprises a printed circuit board with a first signal conductor terminating at an edge of the printed circuit board. A second signal conductor is disposed adjacent to the first signal conductor and terminates at the edge. A conductive metallic spring clip has a relieved area and is formed to fit over the edge of said printed circuit board. The conductive metallic spring clip is positioned on the edge of said printed circuit board such that the relieved area straddles the first signal conductor and the conductive metallic spring clip grips the second signal conductor for coupling the second signal conductor to the chassis mounted connector.

19 Claims, 4 Drawing Sheets

PRINTED CIRCUIT INTERFACE TO AN I/O CONNECTOR

CROSS REFERENCE TO RELATED APPLICATION

This application claims benefit under 35 U.S.C. 120 of an earlier filing date from Provisional Application serial No. 60/290,575 filed May 11, 2001.

FIELD OF THE INVENTION

This invention relates to an inter-connection between a printed circuit board within a device and equipment external thereto, and in particular to an arrangement for directly coupling a circuit board conductor to a connector to facilitate inter-connection.

BACKGROUND OF THE INVENTION

Transferring signals to and from printed circuit boards within an electronic device invariably involves printed circuit board connectors which couple signals to ribbon or wire conductors, coaxial cable etc. The ribbon, wire or coaxial conductors in turn couple the signals from the printed circuit board connector to and from a connection panel which provides an input output capability via conductors coupling to external plant equipment. It can be appreciated that the exemplary signal coupling from a printed circuit board to an I/O connector represents a significant manufacturing cost in terms of both materials and labor. In addition, electronic equipment functioning with high frequency signals, for example in a range from 10 mega Hertz to beyond 1 giga Hertz, can suffer impaired performance. For example, if signal and signal return conductor impedance variations or discontinuities exist at each conductor junction, degraded signal propagation can result. Such impedance discontinuities, also known as return loss, will cause unwanted and undesirable signal reflections which degrade the wanted transmission signal by adding and or subtracting various components of the transmission signal and limiting the maximum interconnection length or signal detection threshold etc.

It is known to provide a direct connective arrangement between a printed circuit board conductor and a connector mounted to the printed circuit board such that when inserted within a module frame or chassis the on-board connector protrudes beyond the module frame, or chassis to provide an I/O connection at a panel. Such an arrangement provides lowered manufacturing and material costs. However, with this arrangement, any subsequent maintenance requires that the user have physical access to the rear connector panel in order to disconnect cabling prior to module removal. Furthermore, any requirement for cable or harness disconnection increases the likelihood of erroneous or wanted signal interruption.

In a further arrangement printed circuit board, PCB, edge conductors are located at a module edge such that when inserted into a module frame the printed edge conductors extend or protrude into and mate with an end portion, or mounting throat of a bulkhead or chassis mounted BNC connector. The connector initials BNC are derived from the bayonet fixing method and the inventor's name Neil Concelman. This connective method offers the advantages of reduced parts count and reduced manufacturing and assembly costs. In addition this connective arrangement can provide a better impedance match between the BNC connector and the PCB conductor, for example, if configured as a micro strip line conductor.

However, maintenance considerations for the repair of an electronic module with such a connective arrangement must facilitate module withdrawal, preferably from the front of the electronic device without any requirement to disconnect cabling at the chassis rear. Clearly, to facilitate multiple withdrawals and insertions of the PCB connector from the BNC mounting throat requires excellent contact performance for both the signal and signal return or ground connections. To provide a return signal connection spring ground clips have been employed attached to the BNC body, as shown in FIGS. 1A and 1B. However this BNC to PCB signal grounding arrangement proved unreliable during multiple insertion and removal cycles. Frequently collisions occurred between the PCB edge and the spring grounding clips causing bending or mechanical deformation. At best the return loss of the connective junction is compromised but more frequently the mechanical damage is such to prevent module insertion and occasionally resulting in signal conductor short circuits. Such spring clip damage is not easily repairable, and requires that the equipment chassis is un-cabled and mechanically disassembled to allow the repair of the hard mounted grounding clips attached to the BNC connectors at chassis rear panel.

SUMMARY OF THE INVENTION

In an advantageous arrangement the signal grounding problems discusses previously are obviated by a circuit board arrangement which facilitates a direct connection to a chassis mounted connector. The arrangement comprises a printed circuit board with a first signal conductor terminating at an edge of the printed circuit board. A second signal conductor is disposed adjacent to the first signal conductor and terminates at the edge. A conductive metallic spring clip has a relieved area and is formed to fit over the edge of said printed circuit board. The conductive metallic spring clip is positioned on the edge of the printed circuit board such that the relieved area straddles the first signal conductor and the conductive metallic spring clip grips the second signal conductor for coupling the second signal conductor to the chassis mounted connector.

In another inventive aspect the conductive metallic spring clip is compressed during insertion into a mounting throat of the chassis mounted connector and advantageously provides a wiping action between the PCB conductors and the mating connector surfaces.

In a further inventive aspect the conductive metallic spring clip is advantageous attached to the PCB by various methods that allow the clip to be slid over the module edge connector and, for example, detent in aligned holes in a PCB signal ground conductor. Thus the inventive conductive metallic spring clip is substantially non-detachably retained on the PCB module to facilitate multiple module insertion and withdrawal cycles.

In yet a further inventive aspect the conductive metallic spring clip can accommodate a degree of movement or misalignment as a consequence of PCB warpage or lack of manual dexterity during module insertion.

DETAILED DESCRIPTION

Figure 1A:
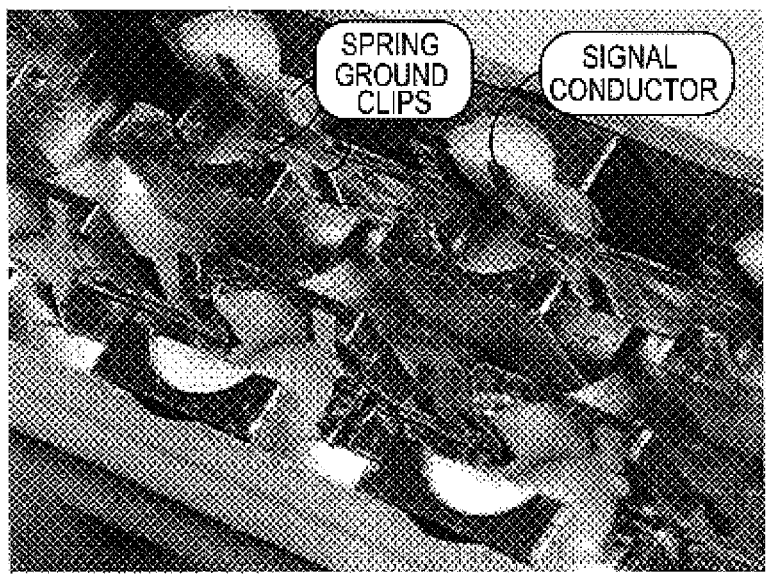
FIGS. 1A and 1B illustrate prior signal grounding arrangements.
Figure 1B:
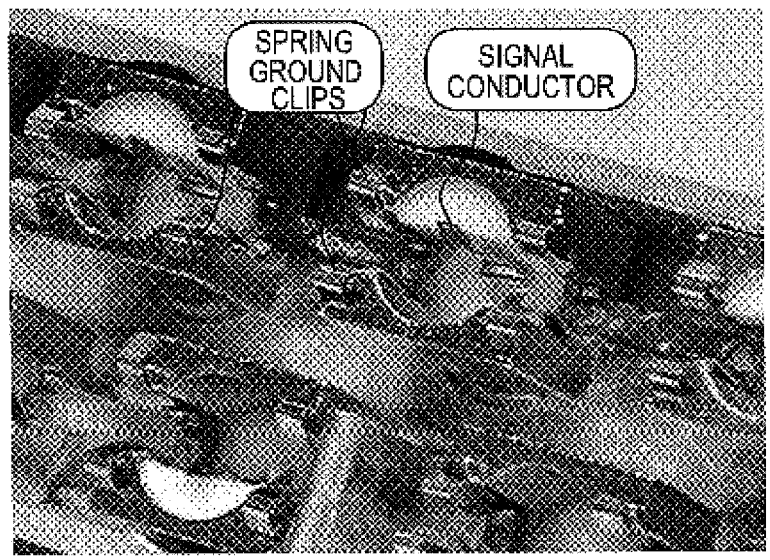

The prior signal grounding arrangement shown FIGS. 1A and 1B offered the benefits of reduced parts count and reduced manufacturing and assembly costs. FIG. 1A illustrates a first connector signal grounding arrangement where spring contacts are arranged in two pairs which are shared between adjacent connectors. The spring contacts extend beyond the body of the BNC connector and are formed to accept a PCB edge connector. Similarly in FIG. 1B which illustrates a further connector signal grounding arrangement which is also arranged in pairs disposed between adjacent bulkhead connector bodies.

However, as has been described, the return signal grounding arrangements of FIGS. 1A and 1B suffered unreliability during module insertion and removal cycles. Module misalignment during insertion of the PCB edge connector into the hard mounted BNC grounding springs resulted in collisions with the grounding springs causing bending or mechanical deformation. Frequently bent spring clips blocked PCB module insertion into the BNC throat and thus rendered the equipment inoperative. Furthermore such damage is not repairable from the chassis front and requires the chassis be un-cabled and removed for mechanical repair.

Figure 2:
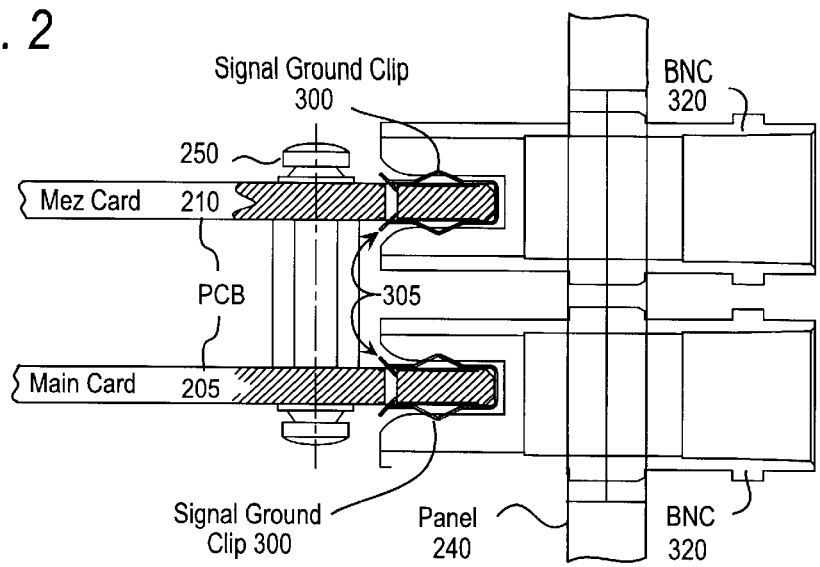
FIG. 2 shows a sectional view of a double module arrangement with an inventive signal return grounding arrangement.

To utilize the advantages of direct PCB to BNC mating but to obviate the problems resulting from module removal and insertion an inventive signal return arrangement was developed. FIG. 2 shows the inventive signal return grounding arrangement with a sectional view of a double module with main (205) and mezzanine (210) printed circuit cards spaced by pillar 250. Each printed circuit card is fitted with the inventive signal grounding arrangement (300) which is depicted mated with bulkhead BNC connectors (320) mounted to connector panel 240.

Figure 3:
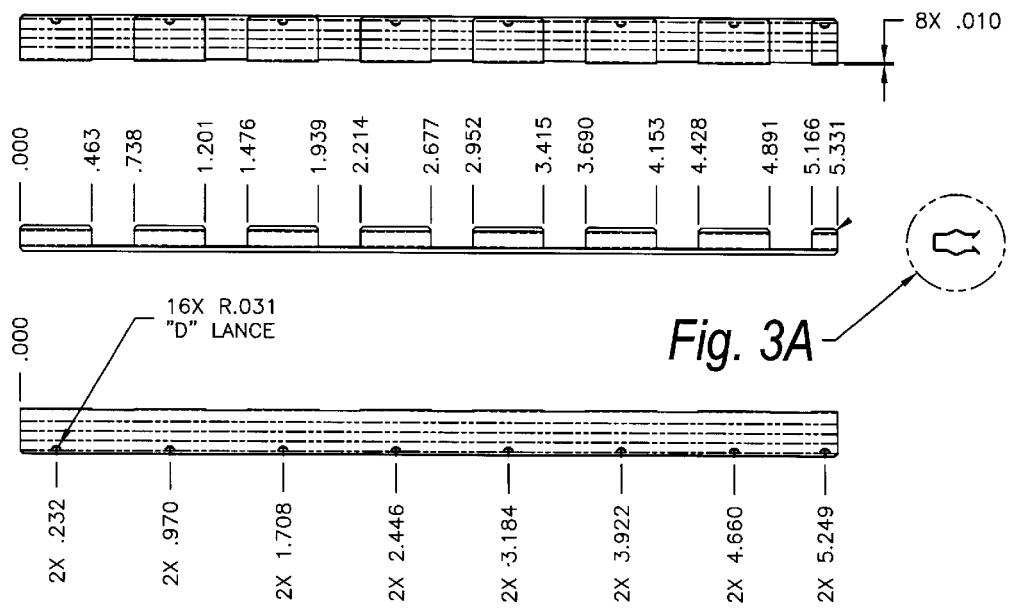
FIGS. 3 and 3A show various views of multiple signal grounding spring clips in accordance with the inventive arrangement of FIG. 2.
Figure 3A:
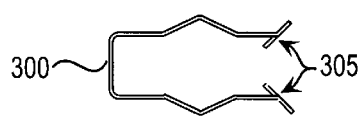

A strip of inventive signal grounding spring clips is depicted with various views in FIG. 3. In particular detailed view FIG. 3A corresponds directly with elements 300 of FIG. 2. In addition detailed view FIG. 3A shows element 305, known as a D lance which advantageously captivates each return signal spring clip to the PCB whilst permitting a degree of relative movement therebetween. In this way PCB to BNC mating misalignment can be mitigated and mechanical damage obviated. The signal grounding spring clips are formed from a flexible electrically conductive metal, capable of gold plating, which can facilitate low ohmic contact resistance and repetitive insertion at multiple connectors. Exemplary spring clip material includes beryllium copper alloy, phosphor bronze alloy or a spring steel material. Although FIG. 3 shows a strip of inventive signal grounding clips the invention is not limited to such multiple connector arrangements and can be advantageously used to provide return signal coupling for a single connector.

Figure 4:
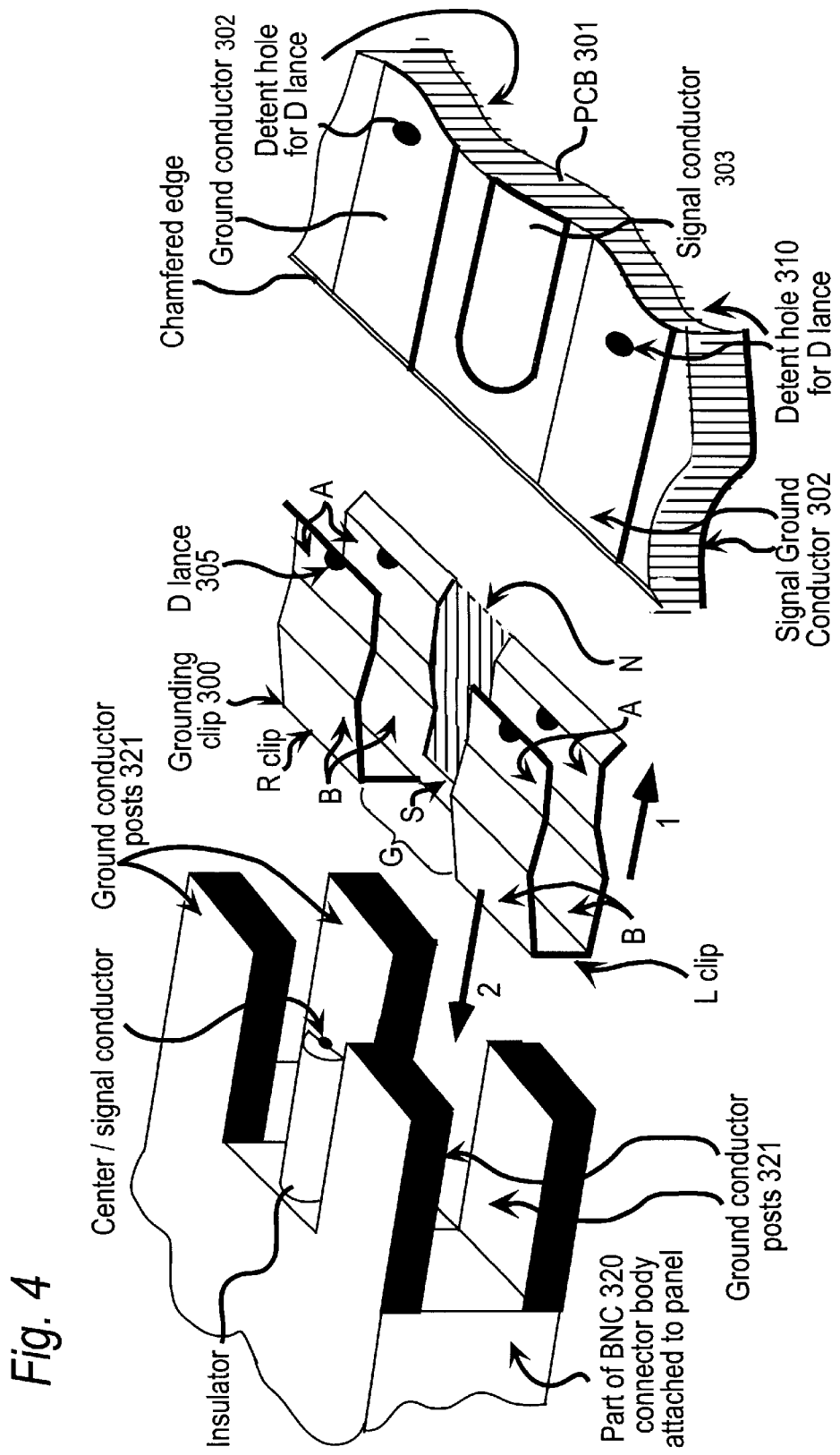
FIG. 4 is a sketch illustrating an assembly sequence for the inventive signal grounding clip with a PCB edge section prior to BNC insertion.

FIG. 4 is a sketch illustrating an assembly sequence for inventive signal grounding clip 300 with a PCB edge connector section 301 prior to insertion into BNC connector 320 throat. In FIG. 4 signal grounding clip 300 is attached to PCB 301 edge section by sliding in the direction of arrow 1. The inventive spring ground clip 300 slides over the edge conductors 302 and 303 until exemplary retention dimples or D lances 305 detent in holes 310 in the PCB 301. These detent holes can fully penetrate PCB 301 and can be plated through. The use of retention dimples, or D lances, not only retain or secure the signal grounding clip embodiment to the module, but advantageously permit a degree of movement thereby facilitating contact wiping at the time of mating between the ground clip 300, the PCB signal ground track 302 and the grounding posts 321 which form the throat of BNC connector 320.

The signal return grounding clip 300 shown in FIG. 4 includes a section N depicted with diagonal shading to illustrate a further advantageous arrangement where shaded section N is removed to accommodate greater degrees of PCB warping or misalignment during module insertion. The removal of shaded section N provides an increased flexibility which facilitates non-planar alignment of individual clip sections. The flexibility results from each individual clip pair, for example, pair L clip and R clip, being joined by a thin metal strip S, which ties together not only each pair of clips L and R but also those of adjacent connectors, not illustrated in FIG. 4.

However, either spring clip embodiment can also be rigidly secured to the PCB by, for example the use of a stake which is passed through the spring clip and PBC via hole 310, plated or otherwise, and swaged over to provide an rigid mechanical attachment and electrical contact attachment of clip 300 to the ground conductors. The swaged stake can be soldered to the ground conductor at either or both PCB surfaces. However, although rigidly attached, the formed shape of the advantageous return signal connection facilitates compression with a corresponding extension into the connector throat.

In a further attachment method, either spring clip embodiment can be secured to the PCB by a rigid fastening which captivates only one of each A surface. Thus if one A side of L and R clip 300 is staked, riveted and or soldered, the other corresponding A side, although retained is free to move and provide contact wiping as mating occurs.

With either spring clip type secured to the module edge connector, by any of the exemplary methods, the assembly is inserted, as indicated by arrow 2, into the mounting throat of the BNC. Clearly the BNC throat aperture, PCB and conductor thickness are chosen to facilitate edge connector insertion and compression of spring clip surfaces B towards each other. The spring compression results in an extension of the spring clip in the direction of one or both arrows 1 and 2. The insertion and surface B compression provide useful wiping of the corresponding contact surfaces which yields a low ohmic resistance and thus a minimized impedance discontinuity.

The second spring clip embodiment depicted in FIG. 4 differs from that shown in FIGS. 2 and 3 in that hashed area N is absent in the second embodiment. By advantageously notching the spring clip, as depicted by area N, each spring contact pair, L and R, is allowed to assume an individual alignment with respect to the mating edge conductor and connector ground posts.

Figure 5:
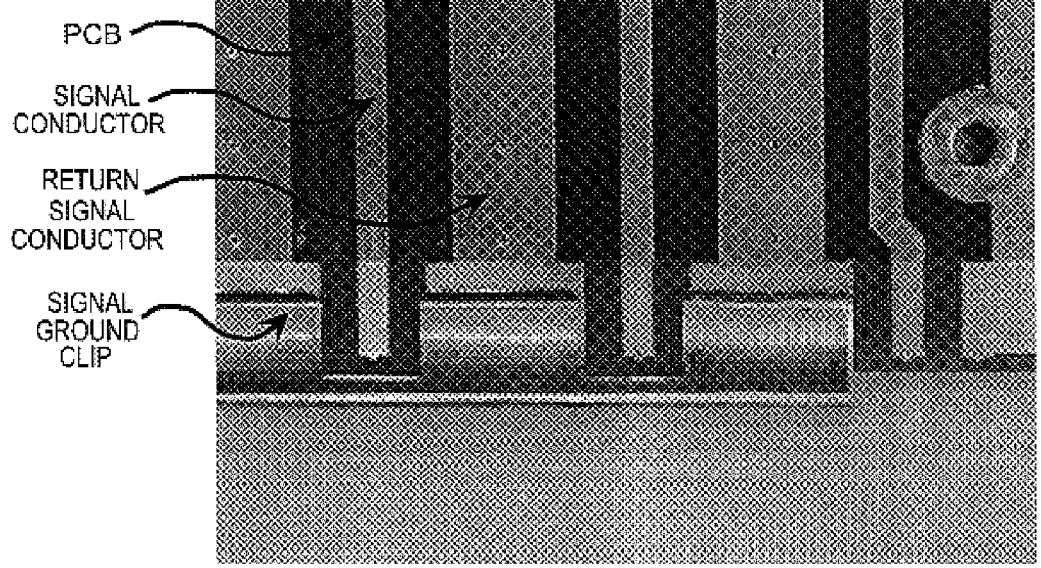
FIG. 5 shows a PCB edge connector assembled with a version of the inventive signal grounding spring clip.

A different embodiment of inventive signal grounding clip is shown in FIG. 5 which is a close up view of the clip assembled on a printed circuit board edge connector prior to chassis and BNC connector insertion.

Figure 6:
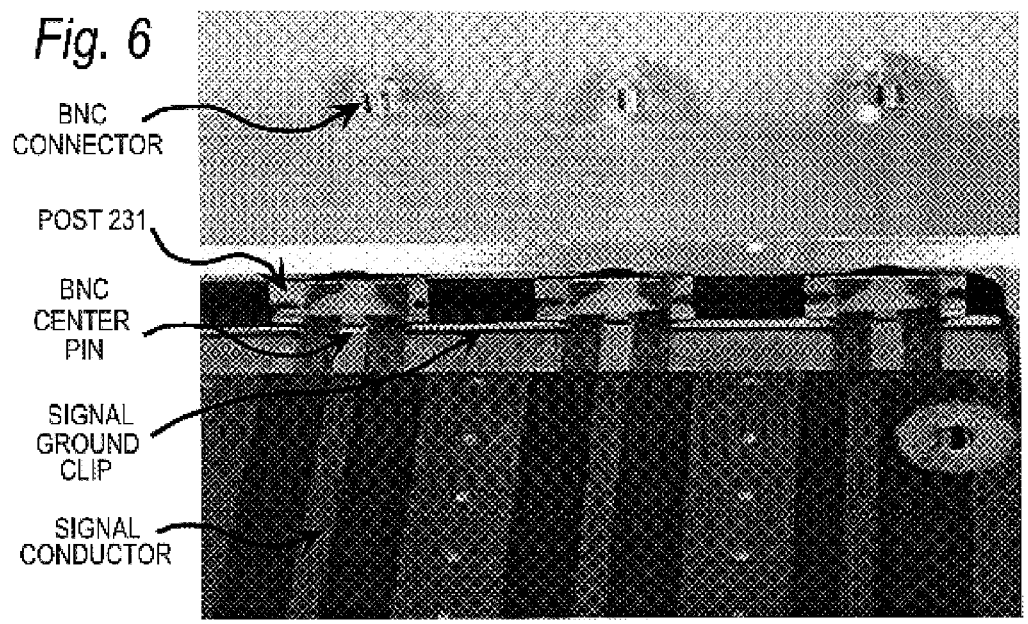
FIG. 6 is an interior view of a chassis rear panel with multiple BNC connectors mated with a PCB edge connector fitted with the inventive signal grounding clip.

FIG. 6 is an interior view of a chassis input output connector panel with a PCB and inventive signal grounding clips inserted in corresponding BNC connectors. In FIG. 6 grounding clips 300 can be seen located between the PCB signal return tracks and the BNC ground posts 321 with signal conductor clearly shown contacting the BNC center conductor. The grounding clips shown in FIG. 6 include section N, as depicted in FIG. 4.

The printed circuit boards illustrated in FIGS. 4, 5 and 6 generally show parallel signal and signal return conductor tracks. Such PCB track layouts can be arranged to provide a specific transmission or characteristic impedance for matched coupling via the connector to external cabling and equipment. The PCB signal and signal return or signal ground track layouts can have various circuit board arrangements with parallel conductors and or conductors positioned on opposite PCB sides or layers, such physical conductor arrangements can be described variously as strip line, microstrip line and coplanar.

Clearly other PCB track layouts, not necessarily having a specific characteristic impedance can also utilize the advantageous signal grounding arrangement to allow multiple circuit board insertion with reliable low impedance coupling to external apparatus.

What is claimed is:

1. A circuit board arrangement facilitating direct connection to a chassis mounted connector, comprising:
   a printed circuit board with a first signal conductor terminating at an edge of said printed circuit board;
   a second signal conductor disposed adjacent said first signal conductor and terminating at said edge; and,
   a conductive metallic spring clip having a relieved area and formed to non-detatchably fit over said edge of said printed circuit board,
   wherein said conductive metallic spring clip is positioned on said edge of said printed circuit board such that said relieved area straddles said first signal conductor and said conductive metallic spring clip grips said second signal conductor for coupling said second signal conductor to said chassis mounted connector.

2. The arrangement of claim 1, wherein said conductive metallic spring clip is formed with a retaining means to non-detatchably grip said printed circuit board.

3. The arrangement of claim 2, wherein said retaining means facilitates movement between said conductive metallic spring clip and said printed circuit board.

4. The arrangement of claim 2, wherein said retaining means attaches only one side of said conductive metallic spring clip to said printed circuit board.

5. The arrangement of claim 1, wherein said conductive metallic spring clip is retained to said printed circuit board by a single point fixing positioned on a part of said conductive metallic spring clip which grips said second signal conductor.

6. The arrangement of claim 1, wherein said conductive metallic spring clip and said printed circuit board are attached one with the other to facilitate a wiping movement therebetween.

7. The arrangement of claim 1, wherein said conductive metallic spring clip formed to non-detatchably fit, is retained at a hole formed in said printed circuit board.

8. The arrangement of claim 7, wherein said hole is sized to permit relative movement of said retaining means within said hole without detachment of said conductive metallic spring clip from said printed circuit board.

9. The arrangement of claim 1, wherein said conductive metallic spring clip is retained to said printed circuit board at a single point located at a non-conductive location on said printed circuit board.

10. The arrangement of claim 1, wherein said chassis includes at least a second connector mounted for insertion by said edge of said printed circuit board, said conductive metallic spring clip being attached to at least a second conductive metallic spring clip by a flexible conductive metallic strip, wherein said edge of said printed circuit board being subject to warping said conductive metallic spring clips conform without detachment from said edge of said printed circuit board subject to warping.

11. The arrangement of claim 1, wherein said first signal conductor couples a signal to said chassis mounted connector signal conductor and said second signal conductor couples a signal return to said chassis mounted connector.

12. An arrangement facilitating direct coupling of a circuit board with a chassis mounted connector having a first signal contact and multiple second signal contacts, comprising:
    a printed circuit board with a first signal conductor terminating at an edge of said printed circuit board;
    a pair of second signal conductors disposed adjacent said first signal conductor and terminating at said edge; and,
    a conductive metallic spring clip having a relieved area is fitted over said edge and captivated to provide relative movement therebetween such that said first signal conductor is positioned within said relieved area and said captivated conductive metallic spring dips clip grip said second signal conductors,
    wherein said printed circuit board with said captivated conductive metallic spring clip is inserted in said chassis mounted connector such that said first signal conductor couples with said first signal contact of said chassis mounted connector and said conductive metallic spring clip is interposed between said multiple second signal contacts of said chassis mounted connector.

13. The arrangement of claim 12, wherein said captivated conductive metallic spring clip is compressed when interposed between said multiple second signal contacts and facilitates movement between respective conductive contact surfaces.

14. A method for assembling a module for use with a chassis mounted connector, comprising the steps of:
   positioning a conductive metallic spring clip at an edge of a printed circuit board;
   locating said conductive metallic spring clip to non-detatchably retain a gripping part of said conductive metallic clip at a signal ground conductor on said printed circuit board;
   inserting said printed circuit board with conductive metallic spring clip into said chassis mounted connector.

15. The method of claim 14, wherein said locating step comprises ensuring motion between said conductive metallic spring clip and said printed circuit board when retained one with the other.

16. The method of claim 14, wherein said inserting step comprises withdrawing said printed circuit board with said attached conductive metallic spring clip from said chassis mounted connector and maintaining attachment one with the other.

17. A circuit board arrangement for facilitating direct connection to a chassis mounted connector, comprising:
   a printed circuit board with a first signal conductor and a second signal conductor disposed adjacent said first signal conductor each terminating at an edge of said printed circuit board; and,
   a conductive metallic spring clip having a relieved area and a retaining area for attaching said conductive metallic spring clip at said edge of said printed circuit board in contact with said second signal conductor, wherein
      said retaining area attaches said conductive metallic spring clip to said printed circuit board and facilitates coupling and uncoupling of said second signal conductor of said printed circuit board and said chassis mounted connector without detachment of said conductive metallic spring from said printed circuit board.

18. The circuit board arrangement of claim 17, wherein said retaining area facilitates movement between said conductive metallic spring clip and said printed circuit board.

19. The circuit board arrangement of claim 17, wherein said retaining area of said conductive metallic spring clip is formed to non-detatchably grip said printed circuit board.

* * * * *